United States Patent
Morris et al.

(10) Patent No.: US 8,412,124 B2
(45) Date of Patent: Apr. 2, 2013

(54) MULTI-BAND PEAK POWER REDUCTION

(75) Inventors: Bradley John Morris, Ottawa (CA);
Neil McGowan, Stittsville (CA); Sai Mohan Kilambi, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 78 days.

(21) Appl. No.: 13/190,660

(22) Filed: Jul. 26, 2011

(65) Prior Publication Data
US 2013/0027090 A1    Jan. 31, 2013

(51) Int. Cl.
*H04B 1/02* (2006.01)

(52) U.S. Cl. ......... 455/91; 455/39; 455/113; 455/115.1; 455/127.1; 375/295; 375/312

(58) Field of Classification Search ............ 455/39, 455/91, 112, 115.1, 127.1; 375/295, 312
See application file for complete search history.

(56) References Cited

U.S. PATENT DOCUMENTS

| | | | |
|---|---|---|---|
| 5,872,531 A * | 2/1999 | Johnson et al. | 341/110 |
| 2002/0012403 A1 | 1/2002 | McGowan | |
| 2002/0191705 A1 * | 12/2002 | Melsa et al. | 375/295 |
| 2009/0316838 A1 | 12/2009 | Fuller et al. | |
| 2010/0098191 A1 | 4/2010 | Morris et al. | |
| 2010/0253420 A1 * | 10/2010 | Xiao et al. | 327/540 |
| 2010/0329401 A1 | 12/2010 | Terry | |

FOREIGN PATENT DOCUMENTS

EP    1469648 A1    10/2004

OTHER PUBLICATIONS

Stefan H. Muller, A Novel Peak Power Reduction Scheme for OFDM,Sep. 1997,p. 1090-1094, PIMRC'97,Helsiniki,Finland.
Dae-Woon Lim,] An Overview of Peak-to-Average Power Ratio Reduction Schemes for OFDM Signals ,Journal of communications and networks , 20009-06,p. 229-239,11,No. 3.
PCTIB2012053254 International Search Report.

* cited by examiner

*Primary Examiner* — Tuan Pham
(74) *Attorney, Agent, or Firm* — Luis Estable; Ericsson Canada Inc.

(57) ABSTRACT

Peak power reduction in transmit chains of multi-band radio-communication devices is performed. By using knowledge of the phase transformations which occur at the upconverter to determine how baseband signal samples will combine at the higher (upconverted) frequency, peak prediction and corresponding baseband signal modification can be performed in a way that reduces peak power of the combined signal.

28 Claims, 8 Drawing Sheets

MULTI-BAND PEAK POWER REDUCTION

TECHNICAL FIELD

The present invention generally relates to radio communication systems, devices and methods and, more particularly, to mechanisms and techniques for peak power reduction in such radio communication systems, devices and methods.

BACKGROUND

At its inception radio telephony was designed, and used for, voice communications. As the consumer electronics industry continued to mature, and the capabilities of processors increased, more devices became available that allowed the wireless transfer of data between devices and more applications became available that operated based on such transferred data. Of particular note are the Internet and local area networks (LANs). These two innovations, among others, allowed multiple users and multiple devices to communicate and exchange data between different devices and device types. With the advent of these devices and capabilities, users (both business and residential) found the need to transmit data, as well as voice, from mobile locations.

The infrastructure and networks which support this voice and data transfer have likewise evolved. Limited data applications, such as text messaging, were introduced into the so-called "2G" systems, such as the Global System for Mobile (GSM) communications. Packet data over radio communication systems became more usable in GSM with the addition of the General Packet Radio Services (GPRS). 3G systems and, then, even higher bandwidth radio communications introduced by Universal Terrestrial Radio Access (UTRA) standards made applications like surfing the web more easily accessible to millions of users (and with more tolerable delay).

Even as new network designs are rolled out by network manufacturers, future systems which provide greater data throughputs to end user devices are under discussion and development. For example, the 3GPP Long Term Evolution (LTE) standardization project is intended to provide a technical basis for radiocommunications in the decades to come. Among other things of note with regard to LTE systems is that they will provide for downlink communications (i.e., the transmission direction from the network to the mobile terminal) using orthogonal frequency division multiplexing (OFDM) as a transmission format and will provide for uplink communications (i.e., the transmission direction from the mobile terminal to the network) using single carrier frequency division multiple access (FDMA).

Radiocommunication devices designed in accordance with the newer LTE standard, as well as those designed in accordance with other standards, may have to contend with high Peak to Average Power Ratio (PAPR) issues in their transmit chains. For example, radiocommunication devices which transmit on multiple carriers (frequencies) may generate compound signals having high PAPR which propagate through their transmit chain. In order to meet out-of-band emissions requirements, which may be imposed by the various radiocommunication standards, a power amplifier (and other components) which receives such compound signals and amplifies them prior to transmission needs to provide good linearity across a large dynamic range. This requirement makes power amplifiers used in such radiocommunication devices more expensive.

Accordingly, Peak Power Reduction (PPR) mechanisms and techniques have been implemented to reduce peak power in signals prior to their reaching, for example, the power amplifier. One approach which is sometimes used to reduce the peak power of an input waveform is to implement power clipping. In the power clipping approach, whenever the amplitude of the input signal is lower than a predetermined threshold, the input signal is passed to the output unchanged, and whenever the amplitude of the input signal exceeds the threshold, the output signal is clamped to the threshold level. Of course, the clipping operation destroys some of the information contained in the original signal. However, the user should be able to tolerate this loss of information as long as the threshold is kept sufficiently high.

The afore-described solutions for controlling peak power have generally been directed toward single or narrow band systems which use a single up-converter to present a signal to a single power amplifier. When a radiocommunication system uses two or more up-converters tuned to two or more frequencies, e.g., in a frequency separated system, the signals are typically combined and then amplified by a single power amplifier. In this case, the peak reduction achieved at baseband using the afore-described techniques does not materialize. This difference in the effectiveness of peak power reduction schemes between single or narrow band systems and frequency separated systems is primarily due to the time varying phase of the signals combined at RF relative to the phase under which peak power reduction was performed. Additionally, small amplitude differences in the different frequency bands' transmit up-conversion chains will have some impact on the peak power reduction but the major contributor is typically the different phase between the chains.

This problem has become more apparent with the advent of multi-band power amplifiers (currently in the research stage) where the simultaneous transmission of two widely spaced signals is becoming possible. As an example, consider a multi-band power amplifier capable of simultaneous transmission of a signal in band 3 (DL: 1805-1880) and band 1 (DL: 2110 to 2170). The worst case edge to edge frequency separation in this example is 365 MHz. Producing a combined signal at baseband and performing peak power reduction is very computationally expensive as there is a need to support the separation frequency to represent the combined signal using a high sampling rate. Accordingly, it would be desirable to provide an alternative that requires fewer implementation resources while achieving similar peak reduction as when processed at the higher rate.

SUMMARY

Peak power reduction in transmit chains of multi-band radiocommunication devices is performed. By using knowledge of the phase transformations which occur at the upconverters to determine how baseband signal samples will combine at the upconverted frequencies, peak prediction and corresponding baseband signal modification can be performed in a way that reduces peak power of the combined signal.

According to one exemplary embodiment, a method for reducing peak power of a multi-band signal includes the steps of predicting a peak associated with subsequent combination of a signal sample from a first baseband signal and a signal sample from a second baseband signal, generating at least one scaling value using the predicted peak, modifying the signal sample from the first baseband signal and the signal sample from the second baseband signal using the scaling value to generate first and second modified baseband signals, upconverting the modified first and second baseband signals to generate first and second upconverted signals, and combining the first and second upconverted signals.

According to another embodiment, a transmitter includes a peak prediction function configured to a peak associated with subsequent combination of a signal sample from a first baseband signal and a signal sample from a second baseband signal, a scaling value generation function configured to generate at least one scaling value using the predicted peak, a signal modification function associated with each baseband signal and configured to modify the signal sample from the first baseband signal and the signal sample from the second baseband signal using the scaling value to generate first and second modified baseband signals, an upconverter function associated with each baseband signal and configured to upconvert the modified first and second baseband signals to generate first and second upconverted signals, and a combiner function configured to combine the first and second upconverted signals.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments of the present invention refers to the accompanying drawings. The same reference numbers in different drawings identify the same or similar elements. The following detailed description does not limit the invention. Instead, the scope of the invention is defined by the appended claims.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification are not necessarily all referring to the same embodiment. Further, the particular features, structures or characteristics may be combined in any suitable manner in one or more embodiments.

Exemplary embodiments address peak power reduction in frequency separated systems by predicting the phase translation which will occur during the up-conversion of each frequency band's corresponding baseband signal. The predicted phase translation can then be used to modify one or more of the baseband signals such that when the modified baseband signal(s) are combined, large peaks in the combined, frequency separated signal are avoided. In this context, such systems will employ at least two different frequency bands which are separated in frequency by a non-zero amount. In some exemplary embodiments, the non-zero frequency separation between the two different frequency bands may be substantial, e.g., on the order of hundreds of MHz, although substantial separation is not required.

Figure 1:
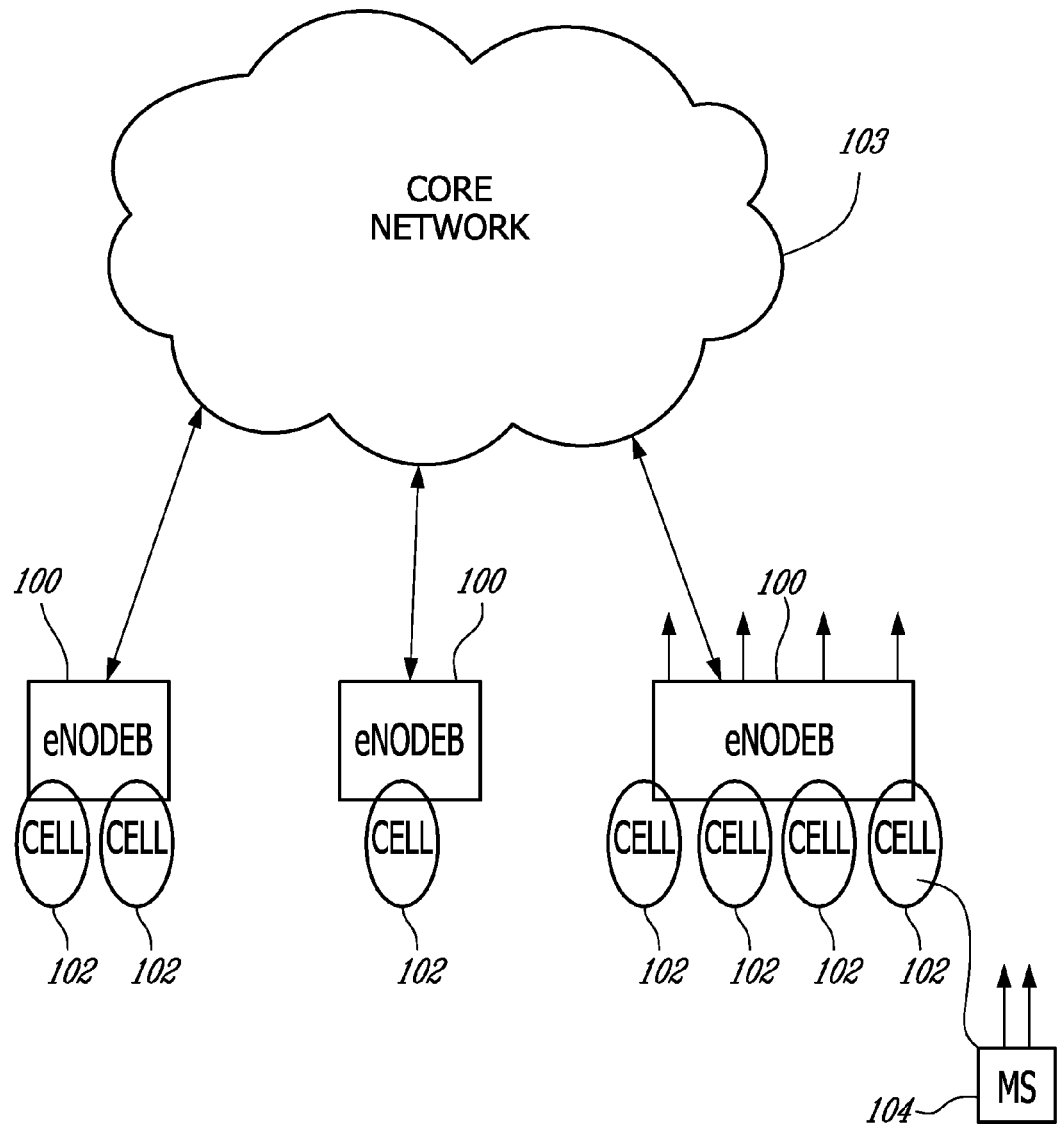
FIG. 1 illustrates an exemplary LTE access network in which exemplary embodiments can be implemented.
Figure 2:
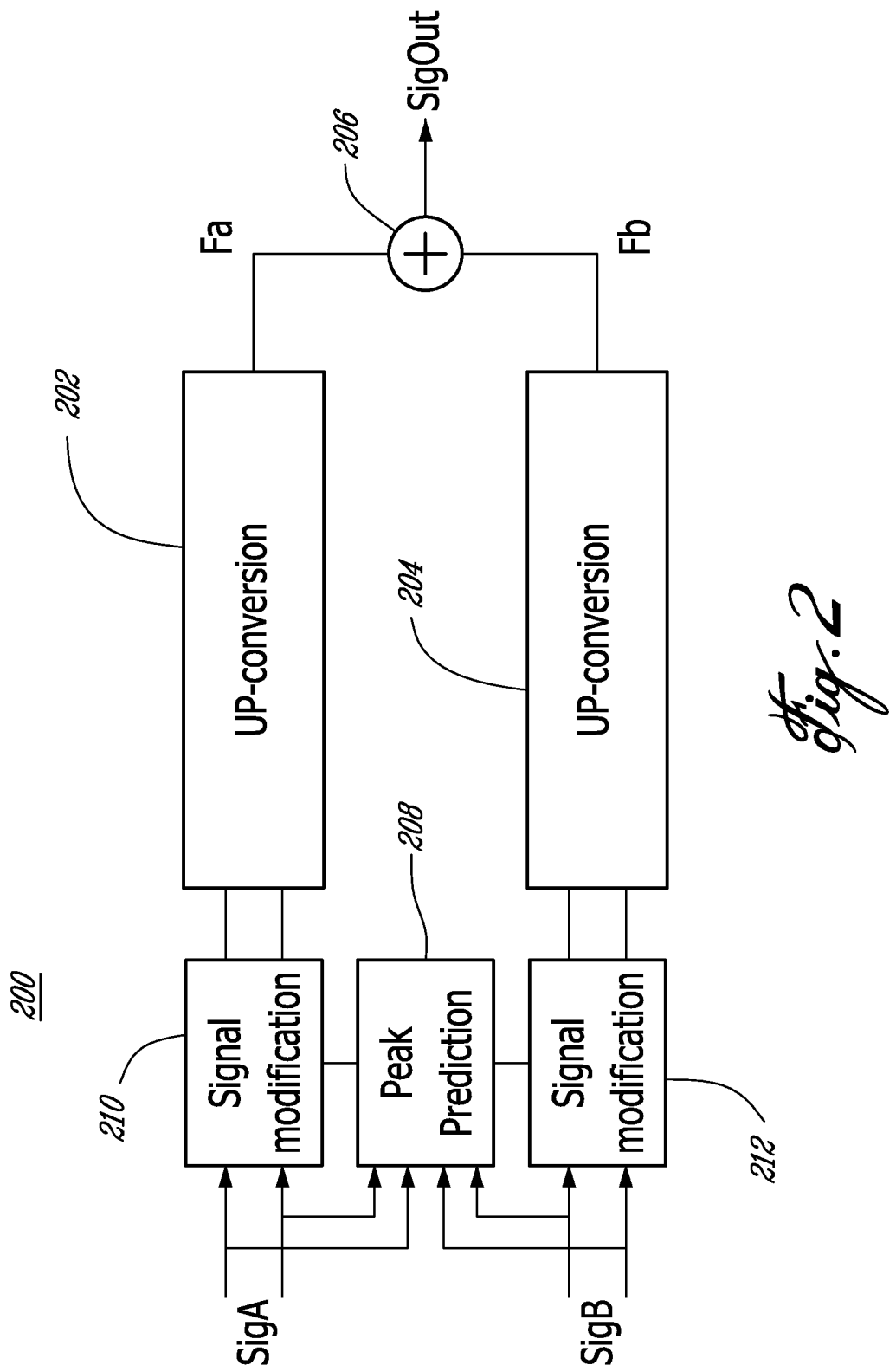
FIG. 2 depicts peak power reduction according to an embodiment.

To provide some context for a more detailed discussion of peak power reduction in multi-band systems according to exemplary embodiments, consider first the exemplary radiocommunication system illustrated in FIGS. 1-2. Beginning with the radio access network nodes and interfaces in FIG. 1, it will be seen that this particular example is provided in the context of LTE systems. Nonetheless, the present invention is not limited in its applicability to transmitters or transmissions associated with LTE systems and can instead be used in any radiocommunication system including, but not limited to Wideband Code Division Multiple Access (WCDMA), CDMA, GSM, UTRA, E-UTRA, High Speed Packet Access (HSPA), UMB, WiMaX and other, systems, devices and methods. Since, however, the example in FIG. 1 is provided in terms of LTE, the network node which transmits and receives over the air interface is termed an eNodeB, several of which eNodeBs 100 are illustrated therein.

In the context of the air interface, each eNodeB 100 is responsible for transmitting signals toward, and receiving signals from, one or more cells 102. Each eNodeB includes multiple antennas, e.g., 2, 4, or more transmit antennas, and handles functions including, but not limited to coding, decoding, modulation, demodulation, interleaving, de-interleaving, etc., with respect to the physical layer of such signals. The eNodeBs 100 are also responsible for many higher functions associated with handling communications in the system including, for example, scheduling users, handover decisions, and the like. The interested reader who desires more information regarding transmit or receive functions associated with LTE or other systems in which these exemplary embodiments may be deployed is directed toward the book entitled "3G Evolution—HSPA and LTE for Mobile Broadband", to Erik Dahlman et al., published by Elsevier Ltd., 2007, the disclosure of which is incorporated by reference. Each of the cells 102 support radiocommunications (uplink and downlink) with one or more mobile stations (MS) 104 (also frequently referred to as "user equipments" (UEs)).

A generalized, exemplary embodiment of a peak power reduction mechanism which can be employed in, for example, eNodeBs 100 or MS 104, to provide peak power reduction for multi-band transmitters is shown in FIG. 2. Therein, two baseband signals (SigA and SigB) are input to processing unit 200 for upconversion in units 202 and 204 to desired RF frequencies Fa and Fb, prior to their combination at combiner or adder 206 and, ultimately, transmission. The signals SigA and SigB are initially provided to both a peak prediction unit 208 and to respective signal modification units 210 and 212. The signal modification units 210 and 212 process the baseband signals SigA and SigB (e.g., by clipping or scaling them) in a manner which is intended to reduce the peak power of the combined signal (SigOut) based on information received from the peak prediction unit 208.

The phase of the signals being combined at combiner 206 impacts whether or not undesirable peaks will be formed in the combined signal (SigOut). Thus according to exemplary embodiments, peak prediction unit 208 identifies potential peaks in the upconverted, combined SigOut using its knowledge of how the upconverters 202 and 204 will operate on the baseband signals SigA and SigB to upconvert these signals to their respective RF frequencies Fa and Fb. More specifically, the phase/amplitude translations which will be performed by any given upconverter 202, 204 on a set of baseband signals can be determined a priori and this knowledge can be used by peak prediction unit 208 to evaluate incoming baseband signals, and to provide signal modification information to signal modification unit 210, 212, e.g., on a sample-by-sample basis.

Figure 3:
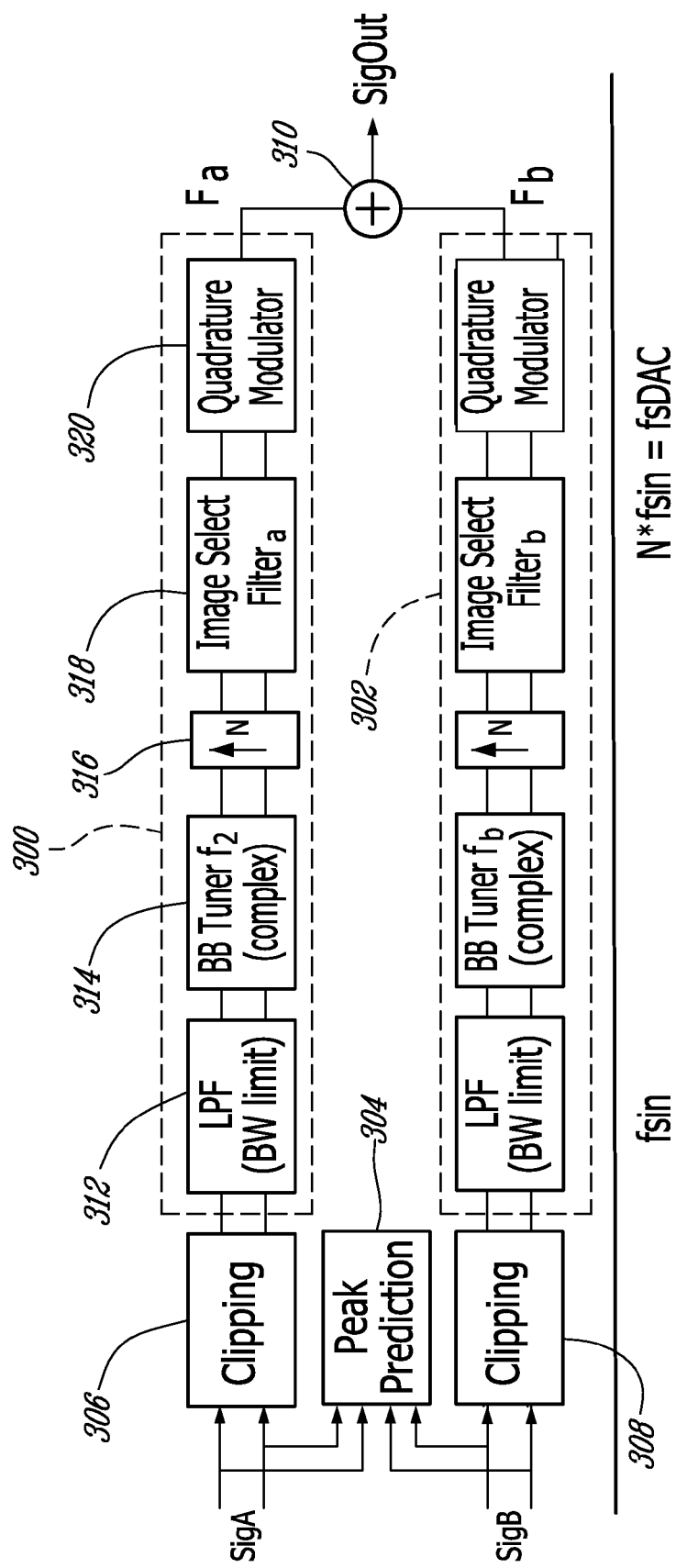
FIG. 3 depicts peak power reduction according to another embodiment.

To illustrate how peak power reduction can be implemented using the general architecture shown in FIG. 2 according to various embodiments, a more detailed example using a specific upconverter architecture will now be described with respect to FIG. 3. However it should be appreciated by those skilled in the art that the present invention is not limited to application with the particular upconverter architecture shown in FIG. 3 and can be used with other upconverter architectures. More specifically, FIG. 3 shows an exemplary embodiment that takes advantage of knowledge regarding how the specific digital up-converters 300 and 302 operate to predict, by peak prediction unit 304, the up-conversion translation (phase and amplitude) which will occur when the digital up-converters 300 and 302 process samples of baseband signals SigA and SigB. Based upon these predictions, peak prediction unit 304 will instruct clipping (or scaling) units 306 and 308 to selectively clip the incoming baseband signals prior to their upconversion in such a way that the desired combined signal (SigOut) experiences peak reduction upon being combined at unit 310. Both input signals, sigA and sigB, are at baseband in this exemplary embodiment, although this is not required for all embodiments. The low pass filters are provided to limit the post clipping bandwidth of the signals. The digital nature of the up-converters makes it straight forward to predict what the signal transformation (phase and amplitude) is going to be from baseband to the combining node.

As mentioned above, the choice of this particular upconverter architecture for units 300 and 302 is purely exemplary and this type of upconverter is itself described in U.S. Patent Application Publication 2010/0098191, the disclosure of which is incorporated herewith by reference in its entirety. Briefly, each upconverter 300, 302 includes a low pass filter (LPF) 312 which limits post-clipping bandwidth of the signals, a (complex) baseband tuner 314 to shift the particular baseband frequency input to each upconverter to a reference frequency, a digital up-sampler 316 which upsamples the baseband signal by outputting N samples for every sample input to the up-sampler (N being selected based upon, for example, the frequency bands Fa or Fb and the sampling rate in the transmit chain), an image select filter 318 which filters out undesired images, and a quadrature modulator 320.

For the particular (yet purely illustrative) upconverter architecture 300, 302 shown in FIG. 3, a peak prediction unit 304 can be designed according to an embodiment as follows. As mentioned above, for any given upconverter architecture the phase/amplitude translation which will be imparted to samples in sets of baseband signals being input for upconversion can be predicted. Nominally, for the upconverter architectures 300, 302, there will be a very large number of possible phase relationships for an arbitrary input baseband signal. However, for a band limited signal entirely in the passband of the upconverter 300, 302, it is expected that there will be only N possible phase relationships since the phase relationships will repeat every N samples for a given combination of the digital upsampler 316 and image select filter 318.

Thus, in order to provide the peak prediction unit 304 with the knowledge of all possible phase relationships or transformations which occur due to the operation of the upconverters 300, 302, these N phase relationships can be calculated based on knowledge of various parameters as shown below by way of exemplary Matlab code.

```
function cmplxPF=phaseFactor(fTune, tGrpoly, fsIn, fsDAC, N)
% cmplxPFA=phaseFactor(fTune, tGrpoly, fsIn, fsDAC, N)
% returns the N complex rotations to predict the output phase of iDRF
% fTune=filter tuning frequency
% tGrpoly=value at the group delay of the filter in samples
% fsIn=BB input sample rate
% fsDAC=the sample rate at which the filter runs
% N is the interpolation factor of the iDRF
initCmplxPF=exp(1j*2*pi*fTune*tGrpoly);
rotFreq=round(fTune/fsIn)*fsIn;
if rotFreq>fsDAC/2
    rotFreq=rotFreq-fsDAC;
end
deltaPhase=2*pi*rotFreq/fsDAC;
tempPhase=[0, deltaPhase*ones(1, N-1)];
phase=cumsum(tempPhase);
cmplxPF=initCmplxPF*(cos(phase)+1j*sin(phase));
```

It will be appreciated by those skilled in the art that the foregoing program code is illustrative of one way in which the N phase relationships (e.g., cmplxPF values) can be determined and that other techniques can be applied to calculate the phase relationships. Once the N phase relationships have been calculated, they can be stored in the peak power prediction unit 304 (or in a memory device from which the values can be obtained for use in determining potential peaks based upon incoming baseband signal samples). Since these values are static for a given frequency translation, they need only be calculated once. The usage of these pre-determined phase relationships in peak power prediction and baseband signal modification according to an exemplary embodiment will now be described with respect to FIG. 4.

Figure 4:
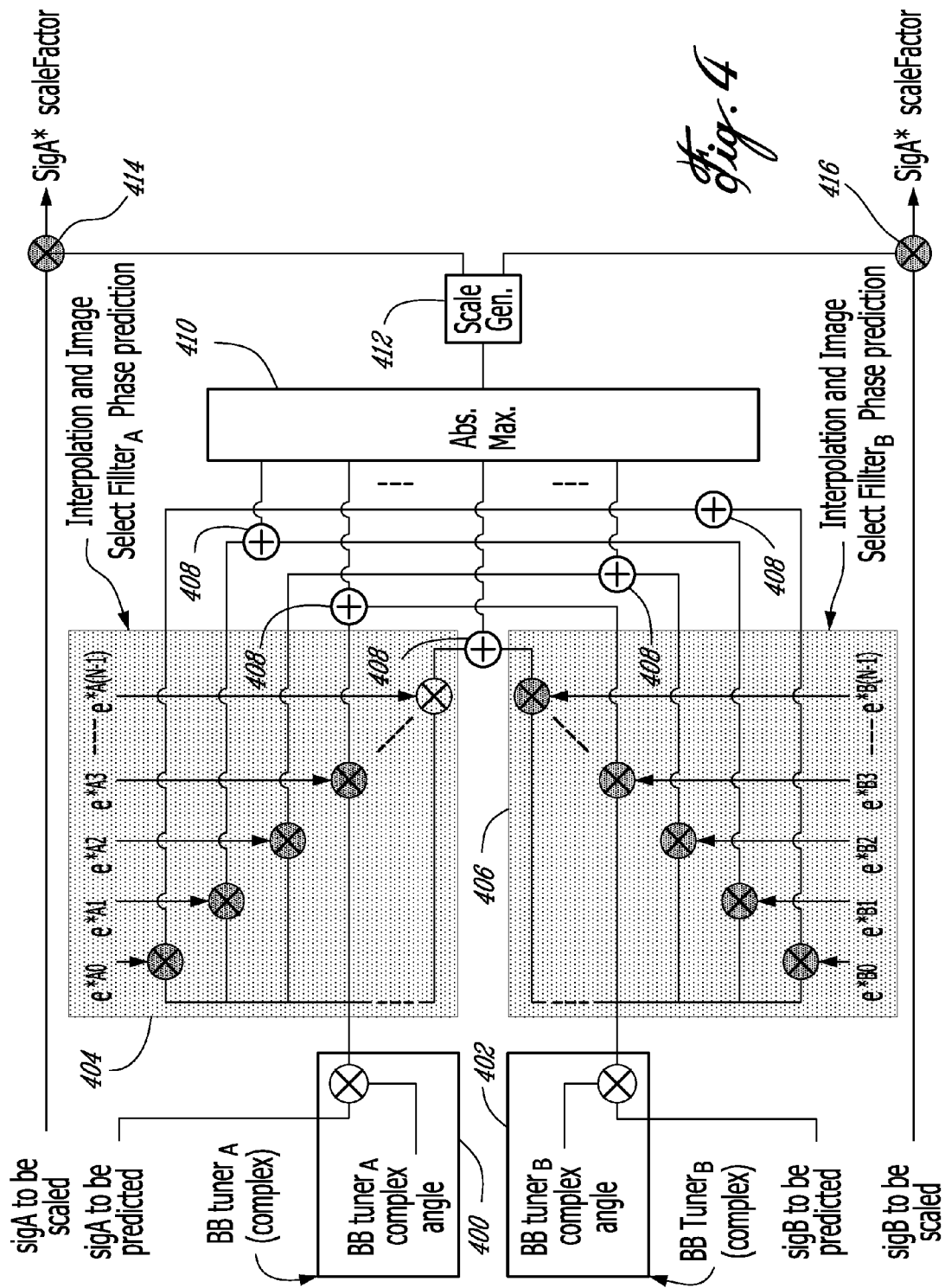
FIG. 4 shows a peak prediction unit according to an exemplary embodiment.

FIG. 4 illustrates one exemplary way in which the signal modification block 210 (or clipping block 306) and peak prediction block 208 (or 304) can be implemented, although those skilled in the art will appreciate that such functions can also be implemented in other ways. Therein, incoming baseband signal samples for each of the baseband signals SigA and SigB can be sent along a prediction path and are first frequency adjusted at blocks 400 and 402, respectively, to reflect the frequency adjustments made to the actual signals in tuners 314. Then, each frequency adjusted sample can be input to interpolation and image select filter phase prediction units 404 and 406, wherein each sample is multiplied with each of the different, pre-determined complex phase transformation values or relationships, i.e., A0-A(N−1) in block 404 and B0-B(N−1) in block 406 (by complex multiplication of the static complex coefficients with time-varying complex data).

Each of the sample versions for SigA and SigB, now adjusted for each possible phase relationship which will be imparted by the upconverter, is output from blocks 404 and 406 to an adder 408 where it is added together with its counterpart sample from the other sample stream. That is, the sample version from baseband signal SigA which has been multiplied with A0 is added to the sample version from baseband signal SigB which has been multiplied with B0, the sample version from baseband signal SigA which has been multiplied with A1 is added to the sample version from baseband signal SigB which has been multiplied with B1, etc., and the sample version from baseband signal SigA which has been multiplied with A(N−1) is added to the sample version from baseband signal SigB which has been multiplied with B(N−1).

Each of the combined samples is then output, according to this embodiment, to a maximum detection function 410 which operates to select the combination of phase adjusted samples from the two baseband sample streams which would generate the largest peak. Information associated with this largest peak value is then output to scale value generator 412, which uses the largest peak value to generate a scaling value for one (or both) of the corresponding samples in SigA and SigB which are to be scaled, i.e., the versions of those baseband signals which will then be sent to the upconverters. The scaling value(s) are then sent to multipliers 414 and 416 where the scaling of the baseband signals SigA and SigB is performed. Note that if the largest peak value received by scale value generator 412 is, for example, below a predetermined clipping/scaling threshold, then the scale value generator may output a value of 1 such that no scaling of the corresponding baseband signal samples is performed.

Note that although the overall scaling requirement is determined by the predicted peak of the combined signal, there can be one or more functions that take this overall scaling requirement as input to produce the individual scaling value for each input signal. In the example of FIG. 4, the overall scaling value is equally applied to both sigA and sigB. However, it will be appreciated by those skilled in the art that according to other embodiments, more scaling can be applied to one signal than the other signal. Moreover, in some situations it may be desirable to apply no scaling to an input signal so that that input signal does not suffer from distortion. For example, consider an exemplary system according to an embodiment wherein the two, frequency separated bands include a WCDMA waveform combined with a GSM waveform. The overall scaling requirements according to this embodiment are based on the combined signal, but the scaling applied to the GSM signal could be zero so that no distortion is imparted on it while a non-zero scaling is applied to the WCDMA waveform.

Further, it will be appreciated that the exemplary techniques described above with respect to FIG. 4 illustrate one mechanism for utilizing phase transformation information to scale or modify input signals which are to be combined after upconversion. For example, and alternatively, the system can compare the phase of one of the input signals with the N possible phases of the second input signal modified by applying the difference in up-converter phase transformations to find the worst case phase alignment. Then, the resulting angle (worst case phase alignment) can be used to modify the second input signal and then combined with the first input signal to perform the peak prediction and hence generate the overall scaling value.

Simulations were performed to illustrate peak power reduction both (1) without using phase transformation information associated with the upconverter (FIG. 5) and (2) using phase transformation information associated with the upconverter (FIG. 6), e.g., in accordance with these embodiments. More specifically, a complementary cumulative distribution function (CCDF) for a two channel scenario that does not use the predictive phase/amplitude techniques described above is shown in FIG. 5. Therein, it can be seen that the difference between the unclipped signal 500 and the best, clipped signal in the group 502 provides a peak reduction 0.858 dB. Although some small peak reduction is shown in the simulation of FIG. 5 as being achieved without using the up-converter transformation information, this peak reduction is believed to be a random event related to the random nature of the peaks in the input signals.

Figure 5:
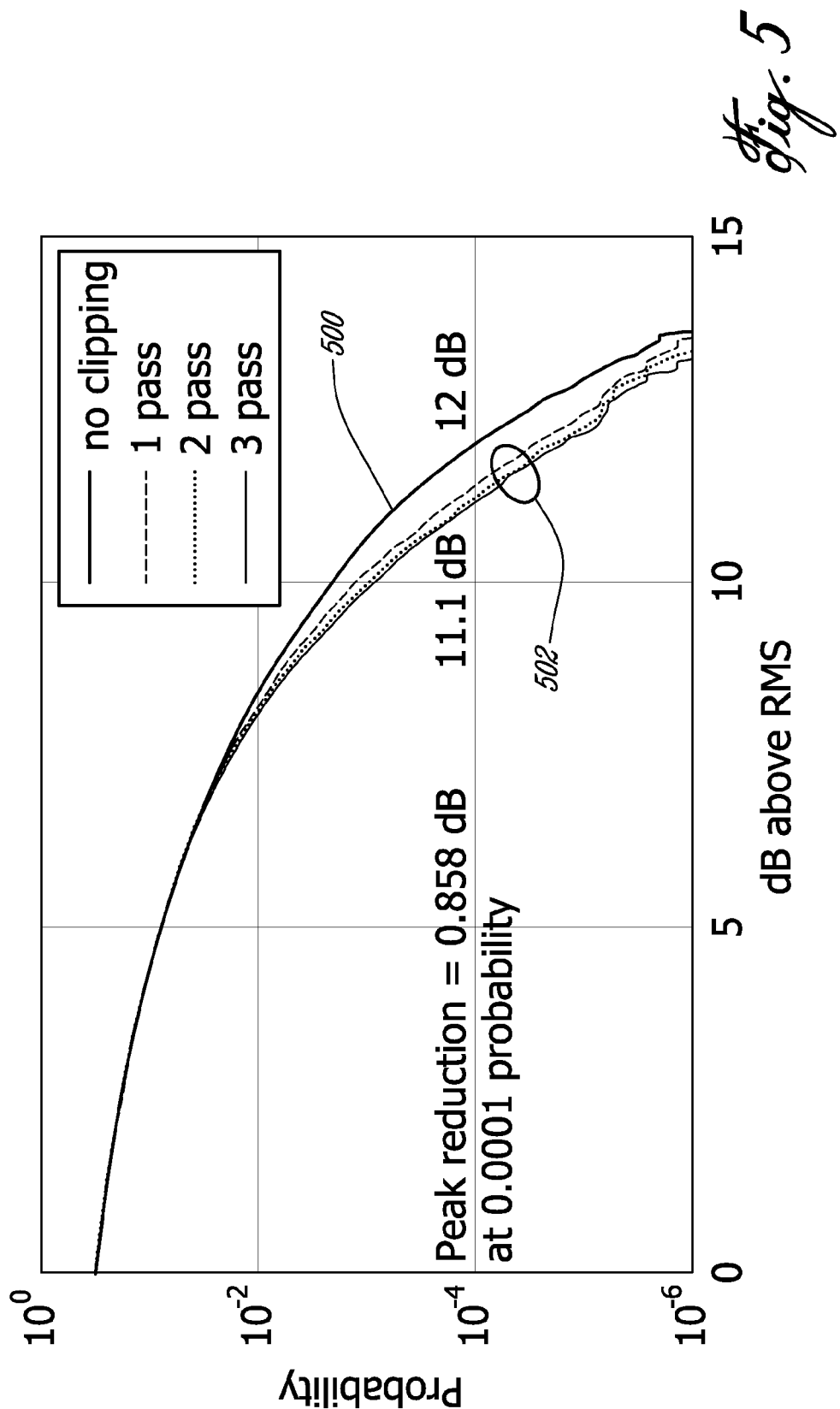
FIGS. 5-6 are graphs depicting simulation results associated with exemplary embodiments.
Figure 6:
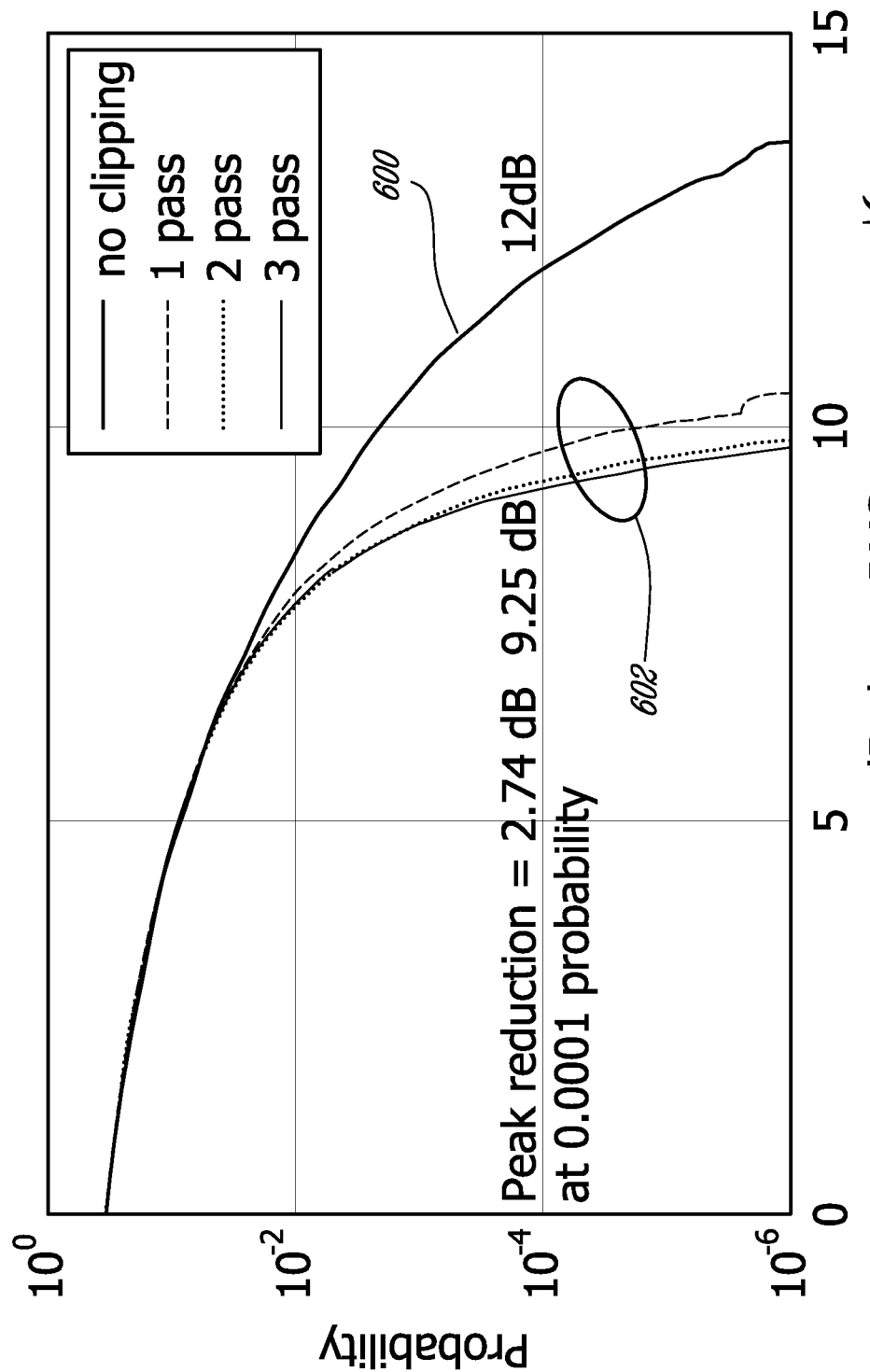

FIG. 6 shows the results of a similar simulation using the same CCDF/two channel scenario as in FIG. 5 wherein improved performance is exhibited by using the up-converted phase/amplitude information in the manner described above. More specifically, relative to the signal 600 which has no clipping or scaling performed on it, a peak reduction of 2.74 dB occurred in this simulation for the best of the signals 602. In both cases the amount of distortion (EVM) created by clipping was the same.

Although not required, the foregoing peak power reduction techniques can be applied on multi-band signals with a large frequency separation between the bands, e.g., where the frequency separation is several multiples of the bandwidth of the signals themselves. For example, the bandwidths of the baseband signals could be 25 MHz and the frequency separation between the upconverted signals could be 100 MHz. As another example, the frequency separation of the two upconverted signals used in the simulations of FIGS. 5 and 6 was 815 MHz.

Note that although the foregoing discussion and embodiments above refer to the combining of two signals, other embodiments can be similarly implemented using three or more signals, or even applied selectively to baseband signals to preserve signal quality e.g. even though post up-conversion combining of all three signals is considered when predicting a peak, only two of the three signals may be modified to achieve peak reduction. In this case the third signal which did not receive modification will be up-converted and transmitted without distortion. Moreover, although digital upconversion may be used in some embodiments to make it easier to predict the phase transformations which will be performed on baseband signal samples by the upconversion circuitry, analog upconversion circuits may also be used. Multiple scaling values can be derived from a priori knowledge of the phase transformations performed by the upconverters, which values may be unique. For example, at least some of the baseband signals being combined may have the same scaling value or, alternatively, at least some of the baseband signals being combined may have a different scaling value.

Figure 7:
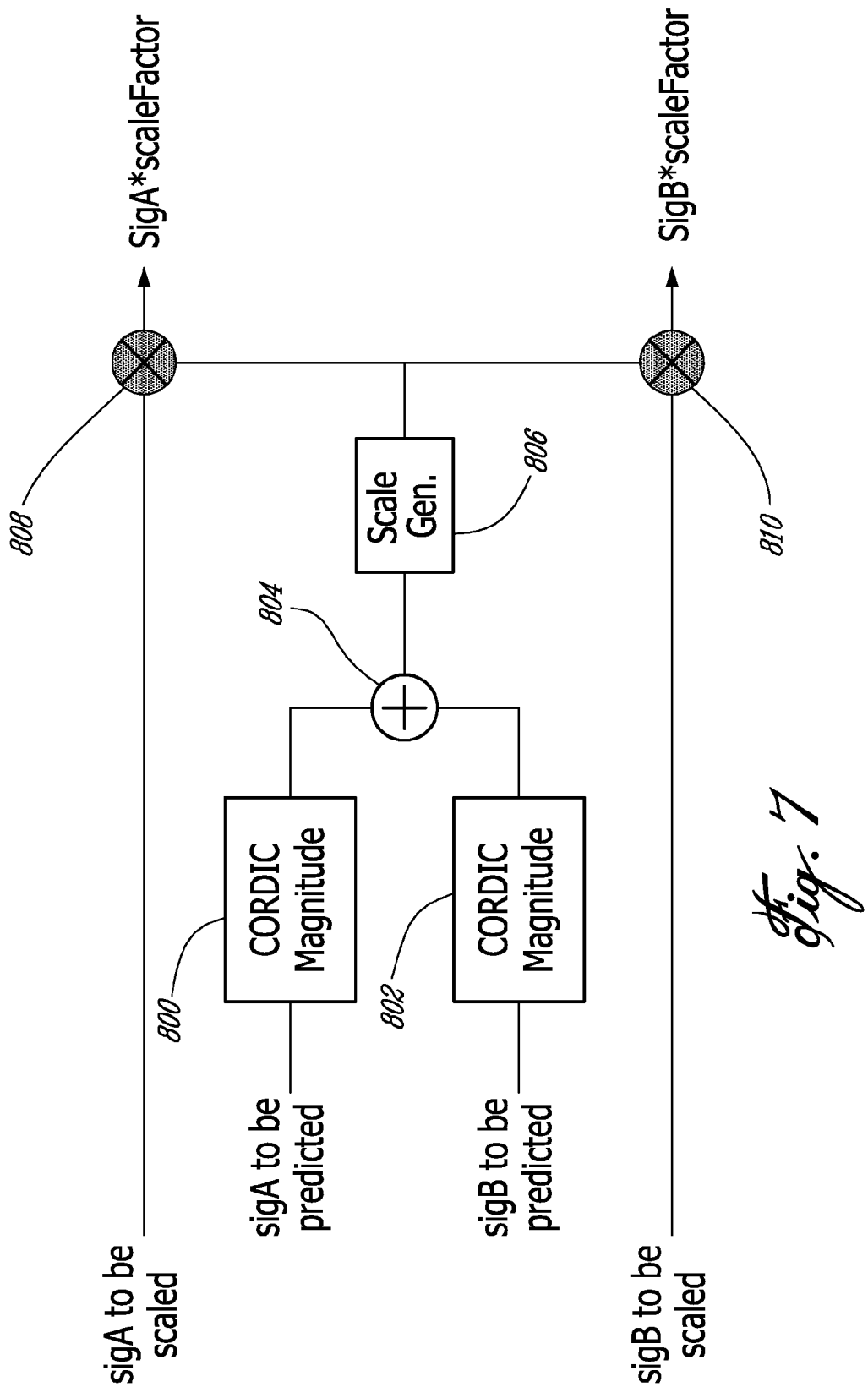
FIG. 7 illustrates a peak prediction unit according to another embodiment.

Using knowledge of the phase transformations of the upconverter enables an optimization in peak power reduction of the combined signal under certain circumstances and in accordance with some embodiments. However under other circumstances and according to other embodiments, e.g., depending upon the frequency separation between the bands being processed and/or the acceptable complexity of the implementation, usage of the actual phase transformations of the upconverter need not be considered in predicting the peaks. For example, as shown in FIG. 7, baseband magnitude clipping can be performed as an alternative to using actual knowledge of the phase transformations of the upconverter to scale the baseband signals. Therein, at blocks 800 and 802, the magnitude of the signal samples from baseband signal SigA and baseband signal SigB, respectively, are determined. At adder 804, the magnitudes are added together and this value is then used by scaling value generator 806 to generate a scaling value (e.g., as if the phases of the two signals after upconversion added together constructively). The resulting scaling value is used as described above in multipliers 808 and 810 to scale the corresponding baseband signal sample. Thus, as used herein, the phrase "predicting the peak" relative to two or more baseband signal samples that will later be combined after upconversion is intended to include (1) predicting the peak using knowledge of the phase transformations performed by the upconverters, and (2) predicting the peak without using knowledge of the phase transformations performed by the upconverters (inclusive of assuming a worst case phase transformation).

Figure 8:
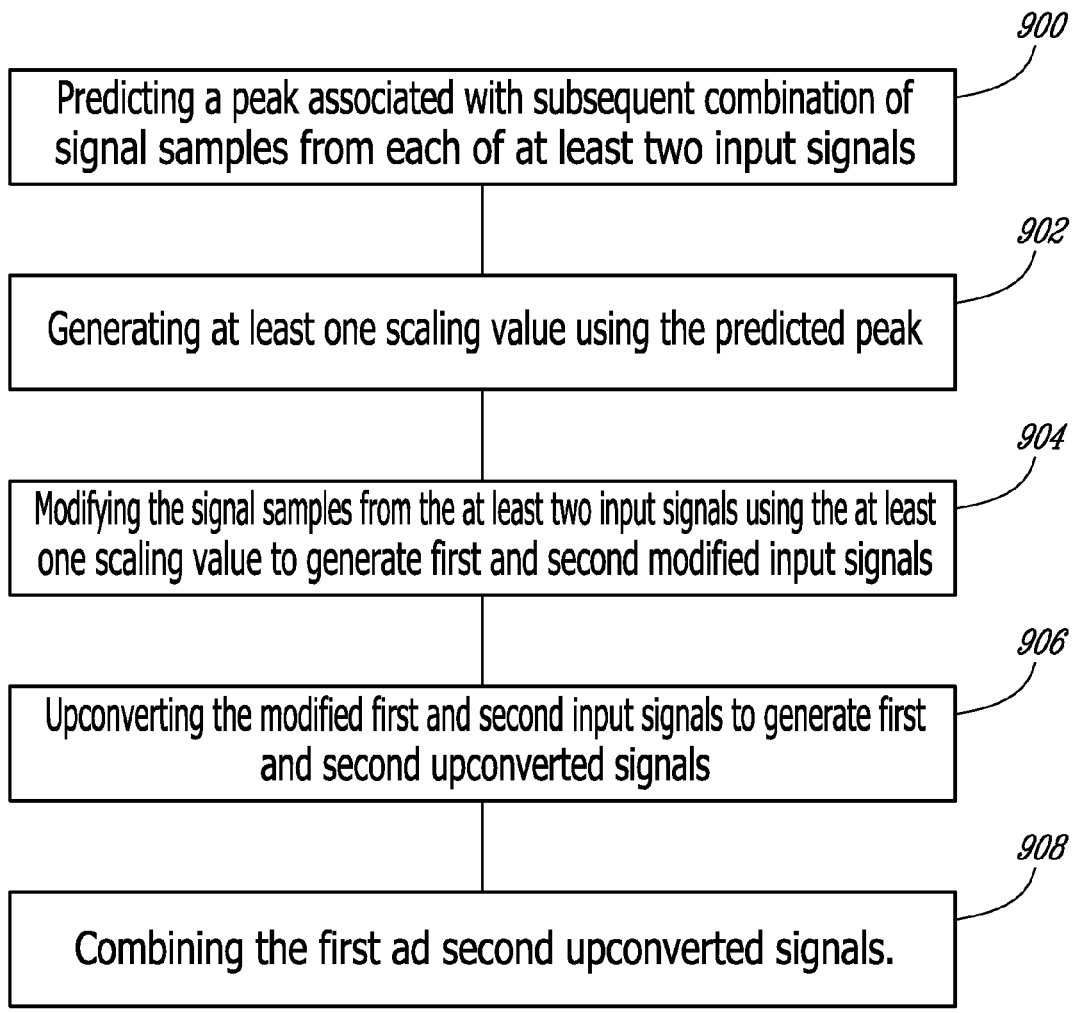
FIG. 8 is a flowchart illustrating a method for peak power reduction according to another exemplary embodiment.

According to an embodiment, a general method for peak power reduction can employ the steps shown in the flowchart of FIG. 8. Therein, at step 900, a peak associated with the subsequent combination of a signal sample from each of at least two input signals is predicted. The predicted peak is used, at step 902, to generate at least one scaling value(s). The signal samples from at least two input signals are modified, at step 904, using the at least one scaling value to generate first and second modified input signals. The modified first and second input signals are then upconverted at step 906 to generate first and second upconverted signals. The first and second upconverted signals can then be combined at step 908.

The foregoing description of exemplary embodiments provides illustration and description, but it is not intended to be exhaustive or to limit the invention to the precise form disclosed. Modifications and variations are possible in light of the above teachings or may be acquired from practice of the invention. The following claims and their equivalents define the scope of the invention.

The invention claimed is:

1. A method for reducing peak power of a signal, comprising:
predicting a peak associated with subsequent combination of a signal sample from each of at least two input signals;
generating at least one scaling value using the predicted peak;
modifying the signal sample from the at least two input signals using the at least one scaling value to generate modified input signals;
upconverting the modified input signals to generate upconverted signals; and
combining the upconverted signals thereby providing a peak power reduced signal.

2. The method of claim 1, wherein the step of predicting further comprises:
using knowledge of phase transformations performed during the upconverting to predict the peak.

3. The method of claim 2, wherein the step of upconverting further comprises:
low pass filtering the modified input signals;
adjusting a frequency of an output of the low pass filtering;
upsampling an output of the frequency adjusting by a factor N;
image select filtering an output of the upsampling; and
quadrature modulating an output of the image select filtering.

4. The method of claim 3, wherein the step of predicting the peak further comprises:
multiplying each of N complex phase transformation values associated with the upconverting with the signal samples from the at least two input signals to generate phase transformed signal samples;
adding a phase transformed signal sample from one of the at least two input signals with a phase transformed signal sample from another of the at least two input signals which has been multiplied with a corresponding complex phase transformation value to generate combined signal samples;
selecting a maximum one of the combined signal samples; and
evaluating the maximum one of the combined signal samples to generate the at least one scaling value.

5. The method of claim 4, wherein the step of evaluating further comprises:
determining whether the maximum one of the combined signal samples exceeds a predetermined threshold.

6. The method of claim 2, wherein the step of using knowledge of phase transformations performed during the upconverting to predict the peak further comprises:
generating a plurality of static, complex phase transformation values based on parameters associated with the upconverting.

7. The method of claim 6, wherein the upconverting is performed using an upsampler and an image select filter and further wherein the parameters include a filter tuning frequency, a group delay value of the image select filter, an input sample rate of the at least two input signals, a sample rate at which the image select filter operates and an interpolation factor of the upsampler.

8. The method of claim 1, wherein a frequency separation between the first upconverted signal and the second upconverted signal is at least 100 MHz.

9. The method of claim 1, wherein the step of predicting further comprises:
predicting the peak without using knowledge of phase transformations performed during the upconverting.

10. The method of claim 9, wherein the step of predicting further comprises:
assuming a worst case phase alignment will occur between the signal sample from one of the at least two input signals and the signal sample from another of the at least two input signals to predict the peak.

11. The method of claim 1, wherein the step of generating at least one scaling value further comprises:
generating a different scaling value for at least some of the at least two input signals.

12. The method of claim 11, wherein one of the different scaling values is zero and one of the different scaling values is non-zero.

13. The method of claim 1, wherein the step of generating at least one scaling value further comprises:
generating a same scaling value for at least some of the at least two input signals.

14. The method of claim 1, wherein the step of predicting a peak associated with subsequent combination of a signal sample from each of the at least two input signals further comprises:
comparing a phase of one of the at least two input signals with possible phases of another of the at least two input signals modified by applying a difference in up-converter phase transformations to determine a worst case phase alignment;
modifying the another of the at least two input signals using the worst case phase alignment; and
combining the modified another of the at least two input signals with the one of the at least two input signals to predict the peak.

15. A transmitter comprising:
a peak prediction function configured to predict a peak associated with subsequent combination of a signal sample from at least two input signals;
a scaling value generation function configured to generate at least one scaling value using the predicted peak;
a signal modification function associated with each input signal and configured to modify the signal samples from the at least two input signals using the at least one scaling value to generate modified input signals;

an upconverter function associated with each input signal and configured to upconvert the modified input signals to generate upconverted signals; and a combiner function configured to combine the upconverted signals.

16. The transmitter of claim 15, wherein the peak prediction function is further configured to use knowledge of phase transformations performed during operation of the upconverter function to predict the peak.

17. The transmitter of claim 16, wherein the upconverter function further comprises:

a low pass filter configured to filter the modified input signals;

a tuner configured to adjust a frequency of an output of the low pass filter;

an upsampler configured to upsample an output of the tuner by a factor N;

an image select filter configured to filter an output of the upsampler; and a quadrature modulating configured to modulate an output of the image select filtering.

18. The transmitter of claim 17, wherein peak prediction function further comprises:

a first plurality of multipliers each configured to multiply one of N complex phase transformation values associated with the upconverter with the signal sample from one of the at least two input signals to generate first phase transformed signal samples;

a second plurality of multipliers each configured to multiply one of N complex phase transformation values associated with the upconverter with the signal sample from another of the at least two input signals to generate second phase transformed signal samples;

a plurality of adders each configured to add a first phase transformed signal sample with a second phase transformed signal sample which has been multiplied with a corresponding complex phase transformation value to generate combined signal samples;

a maximum function configured to select a maximum one of the combined signal samples; and wherein the scaling value generation function evaluates the maximum one of the combined signal samples to generate the at least one scaling value.

19. The transmitter of claim 18, wherein the scaling value generation function is further configured to determine whether the maximum one of the combined signal samples exceeds a predetermined threshold.

20. The transmitter of claim 16, wherein the peak prediction function is further configured to use a plurality of static, complex phase transformation values based on parameters associated with the upconverter function.

21. The transmitter of claim 20, wherein the upconverter function includes an upsampler and an image select filter and further wherein the parameters include a filter tuning frequency, a group delay value of the image select filter, an input sample rate of the input signals, a sample rate at which the image select filter operates and an interpolation factor of the upsampler function.

22. The transmitter of claim 15, wherein a frequency separation between the first upconverted signal and the second upconverted signal is at least 100 MHz.

23. The transmitter of claim 15, wherein the peak prediction unit is further configured to predict the peak without using knowledge of phase transformations performed by the upconverter function.

24. The transmitter of claim 23, wherein the peak prediction unit is further configured to predict the peak by assuming that a worst case phase alignment will occur between the signal sample from the one of the at least two input signals and the signal sample from the other of the at least two input signals.

25. The transmitter of claim 15, wherein the scaling value generation function is further configured to generate a different scaling value for at least some of the at least two input signals.

26. The transmitter of claim 25, wherein one of the different scaling values is zero and one of the different scaling values is non-zero.

27. The method of claim 15, wherein the transmitter of claim 15, wherein the scaling value generation function is further configured to generate a same scaling value for at least some of the at least two input signals.

28. The transmitter of claim 15, wherein the peak prediction function is further configured to compare a phase of one of the at least two input signals with possible phases of another of the at least two input signals modified by applying a difference in up-converter phase transformations to determine a worst case phase alignment, to modify the another of the at least two input signals using the worst case phase alignment, and to combine the modified another of the at least two input signals with the one of the at least two input signals to predict the peak.

* * * * *

UNITED STATES PATENT AND TRADEMARK OFFICE
CERTIFICATE OF CORRECTION

| | | |
|---|---|---|
| PATENT NO. | : 8,412,124 B2 | Page 1 of 1 |
| APPLICATION NO. | : 13/190660 | |
| DATED | : April 2, 2013 | |
| INVENTOR(S) | : Morris et al. | |

It is certified that error appears in the above-identified patent and that said Letters Patent is hereby corrected as shown below:

In the Drawing:

In Fig. 3, Sheet 3 of 8, for Tag "314", Line 1, delete "$f_2$" and insert -- fa --, therefor.

In Fig. 4, Sheet 4 of 8, below Tag "416", delete "SigA* scaleFactor" and insert
-- SigB* scaleFactor --, therefor.

In the Specification:

In Column 6, Line 4, delete "tGrpoly," and insert -- tGrpdly, --, therefor.

In Column 6, Line 6, delete "tGrpoly," and insert -- tGrpdly, --, therefor.

In Column 6, Line 10, delete "tGrpoly" and insert -- tGrpdly --, therefor.

In Column 6, Line 15, delete "tGrpoly);" and insert -- tGrpdly); --, therefor.

In Column 6, Line 23, delete "sin(phase));" and insert -- sin(phase)). --, therefor.

In the Claims:

In Column 12, Line 32, in Claim 27, delete "method of claim 15, wherein the transmitter" and
insert -- transmitter --, therefor.

Signed and Sealed this
Twenty-fourth Day of September, 2013

Teresa Stanek Rea
*Deputy Director of the United States Patent and Trademark Office*